United States Patent
Arikawa et al.

(10) Patent No.: US 6,778,486 B1
(45) Date of Patent: Aug. 17, 2004

(54) LASER MODULE, OPTICAL HEAD AND OPTICAL INFORMATION RECORDING AND REPRODUCING APPARATUS

(75) Inventors: Kouji Arikawa, Hitachinaka (JP); Susumu Tachibana, Hitachinaka (JP); Kazuo Shigematsu, Hitachinaka (JP); Hideo Taguchi, Takasaki (JP); Shigeru Nakamura, Kokubunji (JP); Tetsuya Tomobe, Hitachi (JP)

(73) Assignee: Hitachi, Ltd. (JP)

( * ) Notice: Subject to any disclaimer, the term of this patent is extended or adjusted under 35 U.S.C. 154(b) by 0 days.

(21) Appl. No.: 09/498,818

(22) Filed: Feb. 4, 2000

Related U.S. Application Data

(63) Continuation of application No. PCT/JP99/04208, filed on Apr. 8, 1999.

(51) Int. Cl.$^7$ ................................................. G11B 7/00
(52) U.S. Cl. ................ 369/112.29; 369/122; 369/44.12
(58) Field of Search ................................. 369/120–122, 369/44.12, 112.27, 112.23, 112.08, 112.26, 112.01, 112.04, 44.23, 44.37, 112.07, 94, 112.29, 53.22, 109.01, 109.02; 257/89, 433; 372/38.05, 36, 50, 99, 107, 108

(56) References Cited

U.S. PATENT DOCUMENTS

| | | | | |
|---|---|---|---|---|
| 4,605,942 A | * | 8/1986 | Camlibel et al. ............. | 257/89 |
| 5,497,366 A | * | 3/1996 | Fujisawa ..................... | 257/433 |
| 5,608,695 A | * | 3/1997 | Yamazaki ..................... | 369/103 |
| 5,793,785 A | * | 8/1998 | Nakanishi et al. ............ | 372/36 |
| 6,016,301 A | * | 1/2000 | Takasawa et al. ....... | 369/112.17 |
| 6,134,208 A | * | 10/2000 | Taniguchi et al. ..... | 369/112.07 |

\* cited by examiner

Primary Examiner—Thang V. Tran
Assistant Examiner—Kimlien T. Le
(74) Attorney, Agent, or Firm—Townsend and Townsend and Crew LLP

(57) ABSTRACT

In a laser module holding a semiconductor laser chip and a reflecting surface, to perform positioning on the semiconductor laser chip with high precision, and reduce the period of production, so as to realize downsizing and cost reduction, reflecting surfaces provided on a silicon substrate has a step portion, and the reflecting surfaces are used as reflecting surface for laser emission light and laser chip positioning surface, for high precision positioning. Further, in a laser module which requires a high level power for recording, slopes opposite to side surfaces of the semiconductor laser chip in a lengthwise direction have a step portion, and in wiring of lower electrodes of the laser chip from the bottom of the sink to an upper portion of the silicon substrate, a slope having an angle with respect to the laser chip lengthwise direction is formed as a gentle slope, then wiring is made via the slope, thus mitigating occurrence of migration.

13 Claims, 7 Drawing Sheets

(A)

(B) detailed view of part C (C) detailed view of d - d' cross section detailed view of e - e' cross section (A)

(B)

LASER MODULE, OPTICAL HEAD AND OPTICAL INFORMATION RECORDING AND REPRODUCING APPARATUS

This application is a continuation of PCT/JP/04208, filed Apr. 8, 1999.

BACKGROUND OF THE INVENTION

The present invention relates to a laser module for optical information processing to record or read information recorded onto an optical recording medium such as an optical disk or magneto-optical disk by using a laser beam. More particularly, the invention relates to a laser module for handling several wavelengths from the combination of DVD and CD or the like, and an optical head and optical information recording and reproducing apparatus using it.

SUMMARY OF THE INVENTION

According to the present invention, it is possible to provide a high-precision and low-price laser module holding a plurality of laser chips, which contributes to reductions in size and cost of an optical head device.

DESCRIPTION OF THE SPECIFIC EMBODIMENTS

Figure 1:
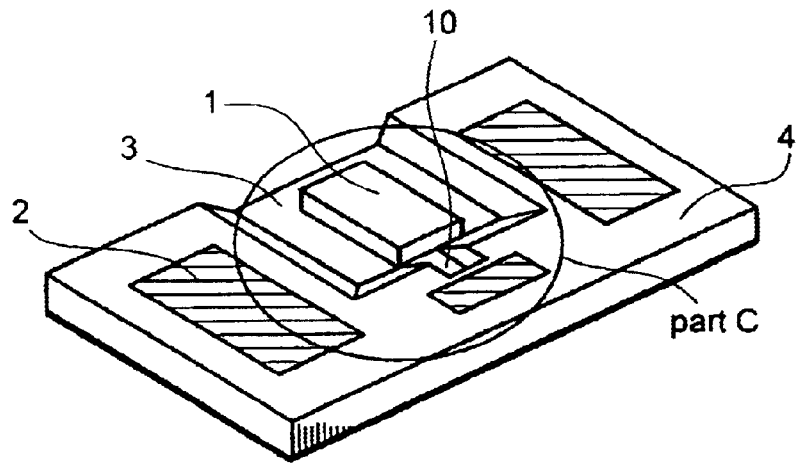
FIG. 1(A) is a perspective view of a laser module showing an embodiment of the present invention.
FIG. 1(B) is an enlarged view of a sink portion of the laser module showing an embodiment of the present invention.
FIG. 1(C) is a cross-sectional view of the laser module showing an embodiment of the present invention.
Figure 1:
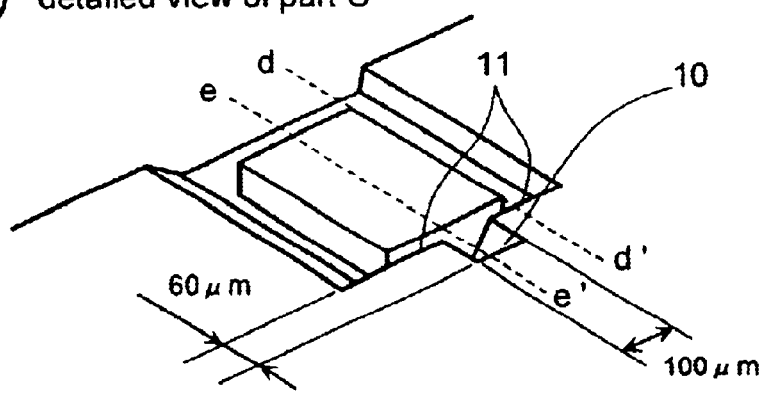
Figure 1:
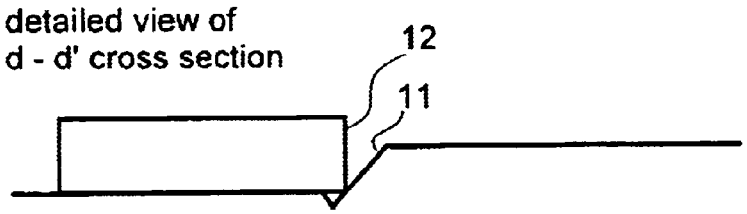
Figure 1:
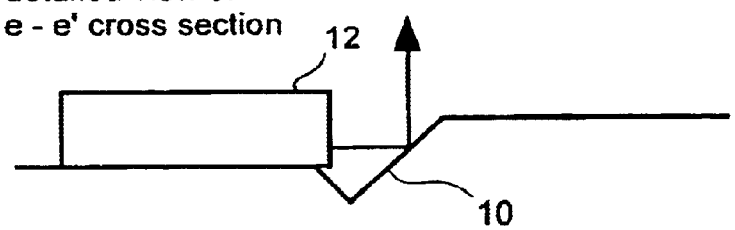

The present invention provides a laser module having a semiconductor laser chip and a silicon substrate including photodetectors and a sink portion, wherein a step portion is provided in a slope of the sink portion. The sink portion provides a reference for positioning a micromirror and the semiconductor laser chip. The present module is applicable to a plurality of laser chips providing different wavelength lasers. It enables a high precision emission angle with the micromirror, and allows reducing the dimensions of an optical head with the same number of parts as that of single-laser module. It also allows focusing a laser beam emitted from the laser module on an optical disk through an objective lens and guiding the reflected light to the photoreceptor in a module through a diffraction grating.

The silicon substrate has an off angle θ on the (100) plane with (011) direction as the axis, an angle α formed with an attachment surface between a laser chip and the silicon substrate and the micromirror surface. Because the relationship $180°-(54.7-\theta)=(125.3+\theta)°$ holds, light reflected by the micromirror surface is offset by $2\times\{(180-\alpha)°-45°\}=(19.4-2\theta)°$ from the vertical direction. Accordingly, to focus the light through an objective lens on an optical disk and guide the reflected light through the deflecting diffraction grating to the photoreceptor in the module, angular adjustment for the offset is performed in an optical head attachment portion of the laser module package or in a silicon substrate attachment portion within the package.

In a laser module requiring a large current such as a DVD-RAM or CD-R (CD Recordable Disc), to prevent occurrence of electro migration, a step portion is provided on a slope as a sink side wall. In wiring a lower electrode of a laser chip from the bottom of the sink to an upper portion of a silicon substrate, a gentle slope having an angle with respect to the laser chip in its lengthwise direction is provided to enable reliable electrode formation.

Because of thermal radiation of DVD-RAM, AuSn material having excellent thermal conductivity is used for attachment between the laser chip and the silicon substrate, and as a package material positioned under the silicon substrate, Fe having excellent thermal conductivity (thermal conductivity: 75 W/mK) or SiN (thermal conductivity: 150 W/mK) or the like is used in place of the conventional Kovar or $Al_2O_3$ (alumina) (thermal conductivity: 17 W/mK), or as the material of heat sink, material having excellent thermal conductivity such as CuW (thermal conductivity: 210 W/mK) is used.

In a CD (Compact Disc) drive using a laser beam having a wavelength of 780 nm, in addition to requirements for reduced size of apparatus for portability as a CD player and a CD-ROM, it is desirable in an optical head to reduce the number of parts and simplify the optical adjustment. Accordingly, as disclosed in, e.g., Japanese Published Unexamined Patent Application No. Hei 1-150244, a semiconductor laser is mounted on a silicon substrate where a reflecting surface for a laser beam (hereinbelow referred to as a "micromirror") and a photoreceptor are included, as a laser module, so as to reduce the number of parts and simplify optical adjustment.

In recent years a DVD (Digital Versatile Disc) having a recording density seven times greater than that of a CD and using a laser beam having a wavelength of 650 nm, is quickly becoming popular in the form of a two-wavelength drive where a conventional CD can be used. An optical head used in this drive includes a laser module, a collimating lens and an objective lens, for DVDs, and a laser module, a collimating lens and an objective lens, for CDs. Accordingly, the optical head itself is large.

Also recently, a DVD-RAM (DVD Rewritable Disk) where recording onto an optical disk can be made, using a semiconductor laser with power about ten times that of conventional CDs and DVDs has appeared on the market. Accordingly, it has become a problem to obtain thermal radiation characteristic to prevent overheating of the semiconductor laser itself, thus extending its lifetime. Today, a semiconductor laser chip and a photoreceptor are provided as independent parts, and as a submount immediately under the semiconductor laser chip, material with excellent thermal conductivity and radiation characteristics such as AlN (aluminum nitride) (thermal conductivity: 150 W/mK) or SiC (silicon carbide) (thermal conductivity: 260 W/mK) is used. Such increase in the number of parts further increases the size of the optical head, increases the number of optical adjustment positions, and greatly increases the manufacturing cost.

In this manner, the increase in the number of functions supporting CD/DVD and additional recording function by DVD-RAM are counter to the smaller, thinner apparatus. Further, a blue laser having a wavelength of 400 nm has been developed and is expected to be practically used in the near future. Accordingly, it will be necessary to consider need for an optical disk drive capable of wavelengths, having convertibility for CDs and DVDs, and support for blue laser. Such multifunction development increases the number of parts of the optical head and causes difficulties in reducing the size of the apparatus, further causing complexity of optical adjustment, which greatly increases costs.

Accordingly, to attain multifunctionality, smaller sized apparatus, it is desirable to employ a laser module where two semiconductor laser chips are attached to a silicon substrate having photodetectors and a one-step deepened concave portion (hereinafter referred to as a "sink" portion), and a micromirror is provided, as disclosed in, e.g., Japanese Published Unexamined Patent Application No. Hei 10-21577. That is, in the case of CD and DVD, it has been necessary to use laser modules having laser light sources and photodetectors, light source switching means, objective lenses and deflecting diffraction gratings corresponding to both wavelengths, then to select a laser beam corresponding to the CD or DVD, and obtain the same optical path from the laser light source to the disk as that in case of a single-wavelength laser module.

Figure 9:
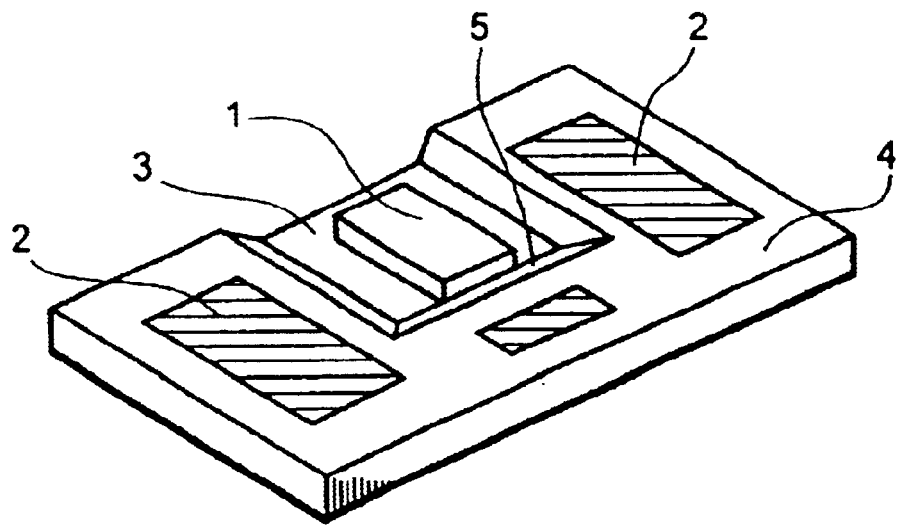
FIG. 9 is a perspective view of a laser module.
Figure 10:
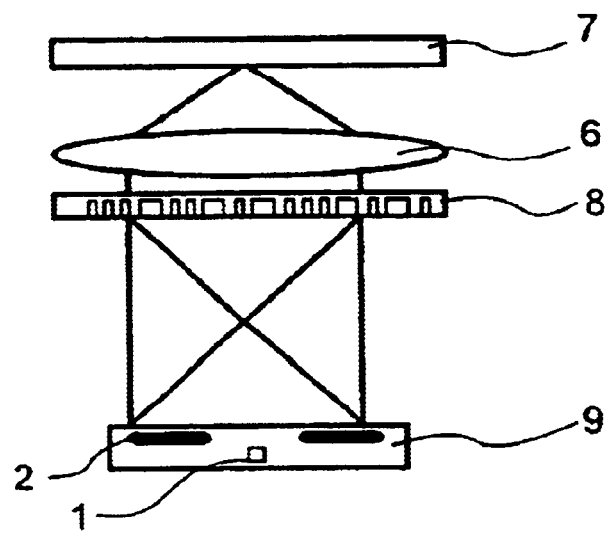
FIG. 10 is a block diagram showing the schematic structure of a optical head.

FIG. 9 shows the structure of a single-wavelength laser module. FIG. 10 shows the structure of an optical head. A laser beam emitted from a semiconductor laser chip 1 is reflected by a micromirror 5, and focused on an optical disk 7 through an objective lens 6. At this time, to ensure the amount of light on the optical disk 7, it is necessary to align the laser chip 1 with the optical axis of the objective lens 6. As the semiconductor laser chip 1 is a very small part having a size of about 0.3×0.7×0.1 mm, position control on the chip itself is difficult. The maximum left and right angular precision of the laser beam to the micromirror surface upon chip attachment is ±2° due to manufacturing techniques which causes minute positional shifts upon attachment. The angular error is resolved by positioning among the deflecting diffraction gratings 8, the objective lens 6 and the optical disk 7 when a laser module 9 is mounted on an optical head. However, the angular precision in case of attachment of arrayed two laser chips is ±4° because each chip has ±2° precision. Thus, a precise optical path between the laser and the optical disk cannot be obtained.

To form amplifiers for CD and DVD photodetectors on a silicon substrate with the same size as a conventional single-wavelength substrate, it is necessary to use a further LSI process technology. The development of this process technique, however, causes problems for formation of a micromirror. A micromirror formed by wet etching using potassium hydrate aqueous solution, based on a phenomenon that an etch rate on (111) plane is about 2-digits lower than that on silicon substrate (100) plane. At this time, the angle between (111) plane and (100) plane is 54.7°, however, the angle is changed to (54.7−θ)° by etching a silicon substrate shifted by an angle θ. The angle θ is referred to as an off angle θ from the (100) plane with direction (011) of the silicon substrate as the axis, and the desired angle is obtained. That is, to raise a laser beam vertically to the module, the off angle θ is 9.7° Because such development of LSI process technology requires very delicate process control, it is difficult to ensure such a large off angle. For this reason, to emit a laser beam along the optical axis of an objective lens, the package structure to hold the module, with the micromirror angle, must be taken into consideration.

In addition, a DVD-RAM laser requires a large current of about 200 mA for recording. In a conventional laser module, a lower electrode of the laser chip is wired onto an upper portion of the silicon substrate via a slope in a right-angled direction to the micromirror. The slope has a nearly right angle, and because the thickness of the placed wiring on the slope becomes thin, the grain boundary of the wiring increases. If a large current flows, the grain boundary may break due to electromigration and the wiring may be disconnects. Further, in a DVD-RAM laser, to prevent reduction of life due to heat generation, some method must be provided for removal of thermal radiation when mounting the laser in the sink portion of the silicon substrate.

Below, embodiments of the present invention will described in accordance with the accompanying drawings.

FIGS. 1(A), (B) and (C) show a first embodiment of the present invention. A difference from the conventional art is that the silicon substrate has a two-level stepped slope, wherein a back slope is used as a micromirror 10 and a front slope is used as a laser chip positioning reference surface 11. The separation between the two slopes is obtained by micromirror design. In this example, the interval is 60 μm. As this dimension is determined by a mask precision used in the etching process, submicron-order precision alignment is used. Further, the width of the micromirror 10 must be set to not be influenced by the beam expanding angle of the laser beam and mirror surface distortion around a micromirror corner. In this example, the width is 100 μm. In a sink of this structure, as shown in a d–d' cross-sectional view of FIG. 1(C), angular precision of ±1° between the micromirror and a laser chip emission surface is realized by disposing a lower end of a laser chip emission surface 12 against the positioning reference surface 11. Further, because this method performs positioning only by pressing a chip on surface 3 against a portioning reference surface without a complicated measuring system such as involves image processing or other complicated mechanism for positioning, the structure can be produced easily and quickly. Note that as shown in e–e' cross-sectional view of FIG. 1(C), the laser beam is reflected by the micromirror surface 10 and emitted from the module.

Figure 2:
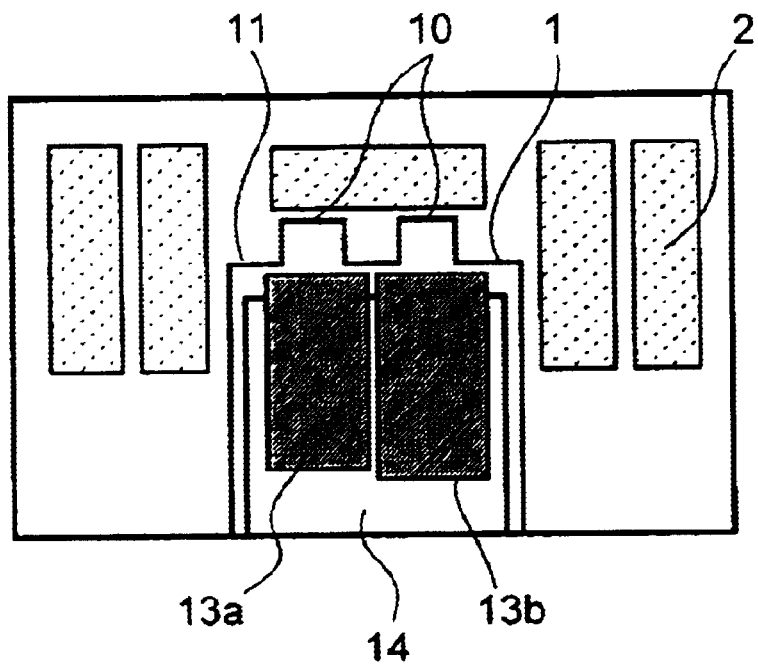
FIG. 2 is a plane view showing an embodiment of a two-laser module of the present invention.

FIG. 2 shows an embodiment with two laser chips are packaged. FIG. 2 is a plane diagram viewed from a position above the sink surface (concave portion) of a silicon substrate including photodetectors on which two laser chips are attached. The two laser chips are 780 nm wavelength CD laser chip 13a and a 650 nm wavelength DVD-RAM laser chip 13b, attached parallel to each other to a sink table 14 with a separation of about 50 μm therebetween. The interval between the micromirrors 10 and the chip positioning reference surface 11 is 60 μm, and the interval between them is maintained in submicron side by the etching process. Accordingly, angular precision of ±1° can be realized just by pressing the two laser chips 13a and 13b against the positioning reference surface 11. In the entire module, ±1.4° angular accuracy is realized.

Figure 3:
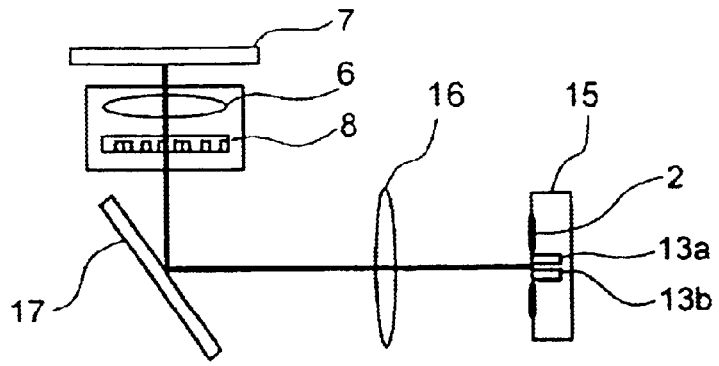
FIG. 3 is a schematic block diagram showing the structure of an optical head device holding the two-laser module of the present invention.

FIG. 3 is a block diagram showing a laser module 15, such as in FIG. 2, mounted on an optical head. In this embodiment, the arrangement includes a collimater 16, a mirror 17, a deflecting diffraction grating 8, an objective lens 6 and an optical disk 7 by using light emitted from the 650 nm wavelength DVD laser chip 13b. At this time, as light emitted from the 780 nm wavelength CD laser chip 13a also passes through the same optical path as that for DVD, and the collimater 16, the deflecting diffraction grating 8 and the objective lens 6 are designed as CD/DVD common parts. This provides a device, corresponding to two wavelengths, having a size equivalent to a conventional single wavelength product to be realized. Some reduction of the light intensity due to omission of special positioning of an optical path of the CD itself can be compensated for by increasing the power of the 780 nm wavelength CD laser chip 13a.

Figure 4:
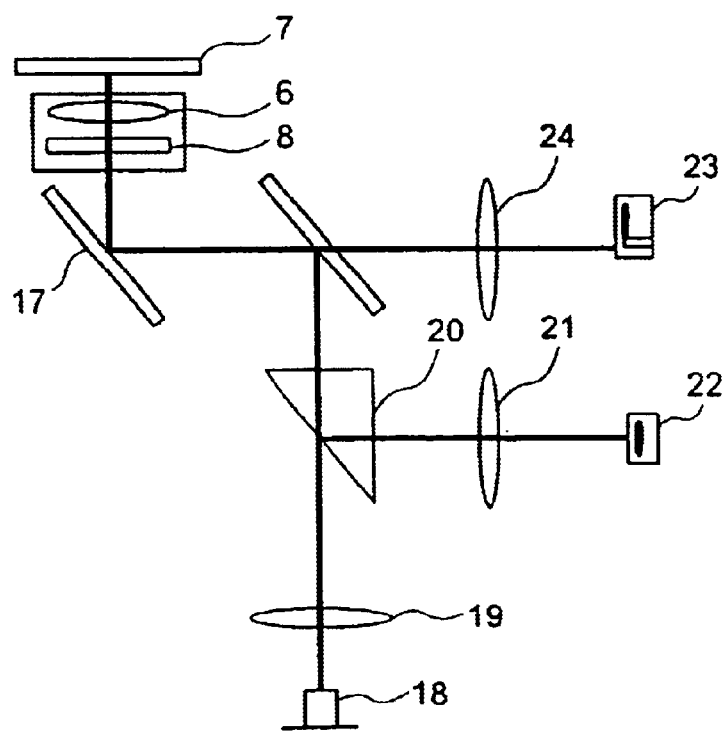
FIG. 4 is a schematic block diagram showing the structure of a conventional optical head device holding two lasers.

FIG. 4 is a block diagram showing a conventional optical head corresponding to separate DVD-RAM and CD wavelengths, for comparison with the present invention. Light emitted from a 660 nm laser diode 18 is focused through a collimater 19, a mirror 17, a separation prism 20, a deflecting diffraction grating 8, and the objective lens 6, on to the optical disk 7. The light reflected by the disk is passed again through the objective lens 6 and the deflecting diffraction grating 8, and is reflected by the separation prism 20. The reflected light enters a photoreceptor 22 for the DVD through the collimater 21. On the other hand, a CD hologram unit 23 where a laser, a photoreceptor and a hologram are integrated is used for CD. Light passes through the collimater 24, and passes through the same optical path as that of light for DVD, and enters the photoreceptor in the CD hologram unit 23. The number of parts in this conventional approach is 12, which is twice that to the embodiment shown in FIG. 3. Because mutual optical adjustment is very complicated, much time is required. The present embodiment achieves a large of cost reduction by reduction of the number of parts and simplification of their alignment.

Furthermore, a device which supports two wavelengths is achieved, but with a size equivalent to a conventional single wavelength driver, by mounting the optical head on the optical drive device, and by using a circuit to automatically select a 780 nm or 650 nm wavelength light source as appropriate to a CD or DVD disk drive.

Figure 5:
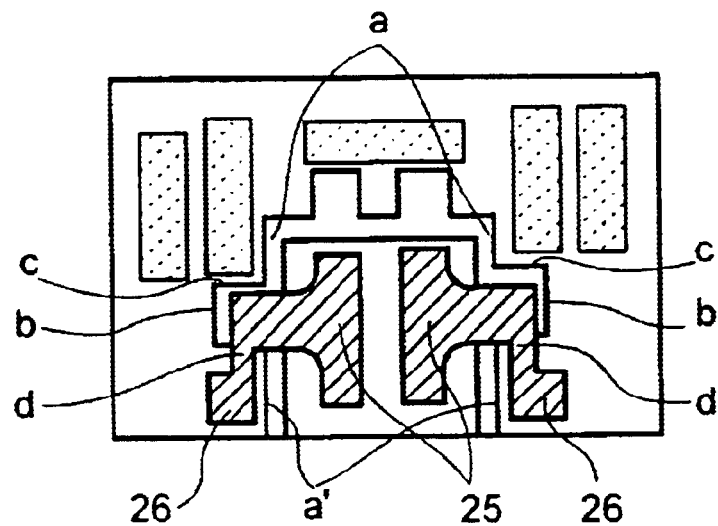
FIG. 5 is a plane view showing an embodiment of a silicon substrate of the laser module of the present invention.

Next, FIG. 5 illustrates an embodiment having step portions in slopes opposite to side surfaces of the semiconductor chip (in its lengthwise direction) in the laser module. This figure shows the structure before the laser chips are attached, and lower electrode 25 under the laser chips to be seen. Slopes a, a' and b opposite to the side surfaces of the semiconductor laser chip are nearly right angles. On the other hand, slopes c and d in a right-angled direction to the slope a, a' and b are more gentle than a, a' and b.

Slope d is the most gentle among these slopes. The difference among these slopes is caused by the difference of etching rates on the silicon crystal-plane. Accordingly, lower electrodes 25 are connected via the portions d to an upper portion of the silicon substrate (26), to provide the thickness for the electrodes. Thus, if a large current is used as in a DVD-RAM laser, electromigration can be prevented. Disconnection can be prevented by designing the slopes such that the sink portion (concave portion) is deeper.

Figure 6:
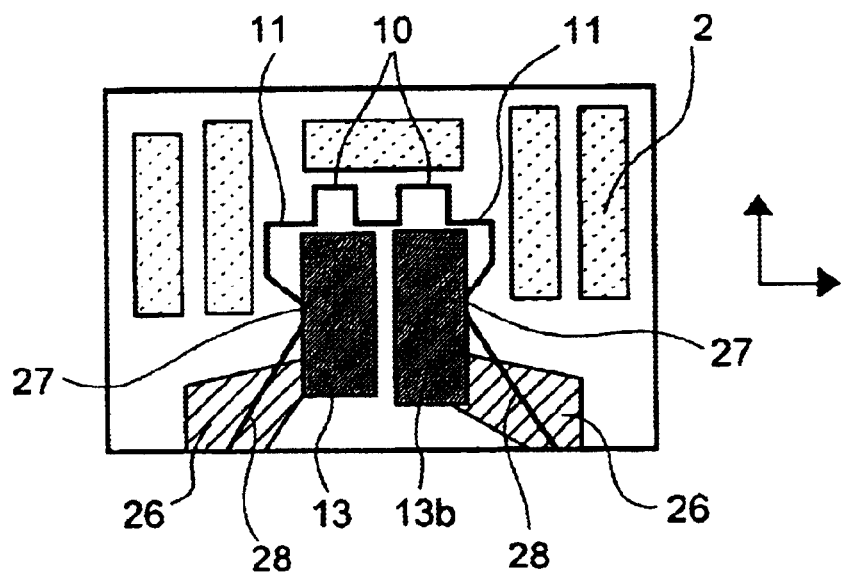
FIG. 6 is a plane view showing an embodiment of the two-laser module of the present invention.

FIG. 6 depicts an embodiment where step portions are provided on the side of the micromirrors of the sink portion and in the slopes opposite to the side surfaces of the semiconductor laser chip in the lengthwise direction. The slopes near the laser chips 13a and 13b are used as chip positioning reference surfaces. Chip positioning reference surfaces 27 and 11 perform precision adjustment respectively in X and Y directions with the photodetectors 2. With their locations positioned by an etching mask, well managed etching conditions realize positional precision ±5 m in the X direction and ±2 m in the Y direction with respect to the photodetectors 2. The laser chips are disposed against the surfaces in the directions X and Y, with these surfaces as reference surfaces, to satisfy the positional relation with the photodetectors 2. The angle formed in a position related to the chip positioning reference surface 27 mitigates the slope angle, allowing wiring to be provided from the lower electrodes to the upper portion of the silicon substrate 26 to prevent electromigration. Accordingly, by using the present sink structure, precision alignment for laser beams can be satisfied by pressing the chips against the slope of the sink without dimensional measurements or image processing. This elimination of adjustment work on the chip itself and further improves operability, thus contributing to cost reduction. Note that the positions of the step portions of the slopes opposite to the side surfaces of the semiconductor laser chip in the lengthwise direction are not limited to those as shown in FIGS. 5 and 6, but may be provided in arbitrary positions within a range producing the above effect. Further, the shape of the step portions on the micromirror side is not limited to that as shown in FIG. 6, but an arbitrary structure producing the desired beam angle can be made. For example, it may be arranged such that the step in a central portion between the lasers 13a and 13b is removed, and the contact portion between the step 11 on one side and the laser is sufficiently large, for positioning by pressing the laser against this portion. Further, positioning can be performed by pressing the laser chip in the directions X and Y against the reference 27 and the step 11 on one side.

Figure 7:
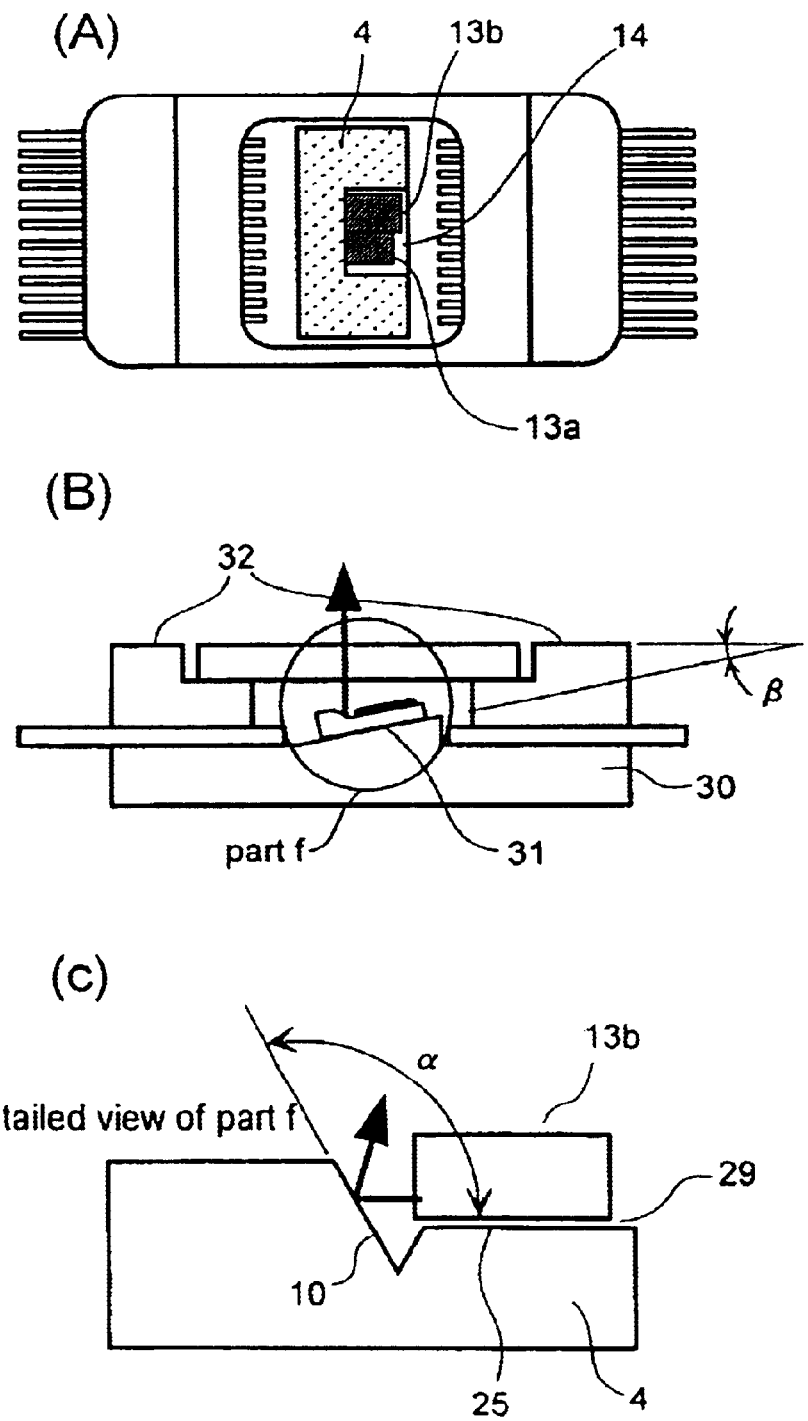
FIG. 7 is a plane view and a cross-sectional view showing an embodiment including a package of the two laser modules of the present invention.

FIG. 7 shows an embodiment of the laser module where thermal radiation from a laser chip, in this case of a DVD-RAM, or the like must be considered. As the package material of a portion in contact with a silicon substrate 4, AlN with excellent thermal conductivity (150 W/mK) and environmental resistance is employed. Furthermore, AuSn solder (thermal conductivity: 57 W/mK) is preferred as an adhesive 29 for the sink table 14 and the laser chip 13a or 13b. Otherwise, use of another material as a package material or an adhesive, the thermal conductivity is desired to be about 50 W/mK or higher for transferring radiation from the laser chip. A thin material between the laser chips and the silicon substrate, which has excellent thermal conductivity, is preferable for removing laser radiation (hereinafter, the thin material will be referred to as heat sink). The thermal conductivity of the heat sink is desired to be equal to or higher than 50 W/mK. TiPtAu is typically employed as the material of the lower electrodes 25.

If material including Au is used in the lower electrodes 25, the Au of the lower electrodes 25 melts into the AuSn solder upon attachment, to raise the melting point of the AuSn solder. Accordingly, when the laser chip 13a has been attached and the other laser chip 13b is attached by using the same AuSn solder, there is a very low risk of re-melting of the solder at the laser chip 13a. Thus, by using material for the electrodes and the adhesives includes Au, attachment of the plural laser chips and radiation can be attained. In radiation from a package 30, heat retention is prevented by forming the structure of the optical head as an aluminum die cast, and bringing the bottom of the package and the aluminum die cast into contact by using an SUS304 (stainless steel) metal plate (or bronze phosphate or FeNiCo or Alloy 42).

In FIG. 7, as the angle cc of the micromirror is $(125.3=\theta)°$ based on the off angle $\theta$ of the LSI process described above, it is offset by $(19.4-2\theta)°$ from $135°$ to vertically reflect a laser beam. For this reason, an angle $\beta=(19.4-2\theta)°$ is provided between an attachment surface 31 of the package 30 to the silicon substrate 4 and an optical head attachment surface 32 of the package 30, to correct the offset.

Because a $\alpha=(125.3+\theta)°$, and , $\beta=(19.4-2\theta)°$, the relation between $\alpha$ and $\beta$, $2\alpha+\beta=270°$ holds. Furthermore, an arrangement may be made such that the optical head attachment surface 32 of the package 30 is sloped (See FIG. 7B), and as the angle $\beta$ between the package 30 and the attachment surface 31 of the silicon substrate 4, $2\alpha+\beta=270°$ holds.

Figure 8:
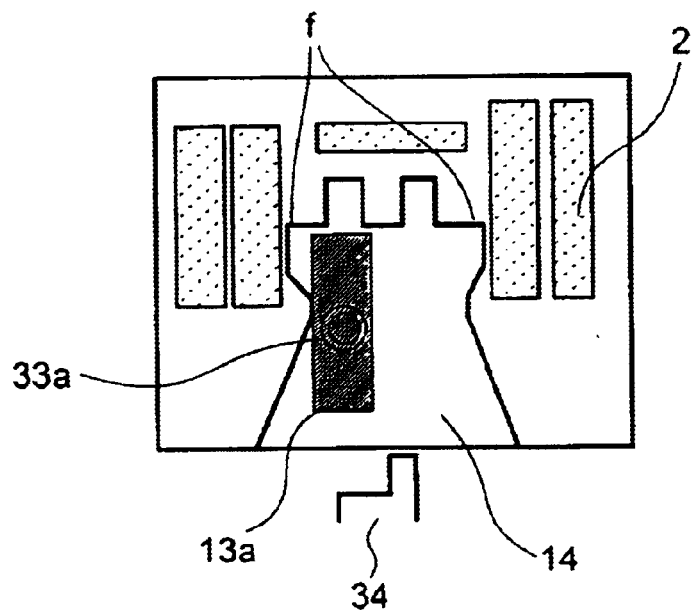
FIG. 8(A) is a plane view showing a method for attaching an initial chip of the two-laser module.
FIG. 8(B) is a plane view showing a method for attaching the next chip of the two-laser module.
Figure 8:
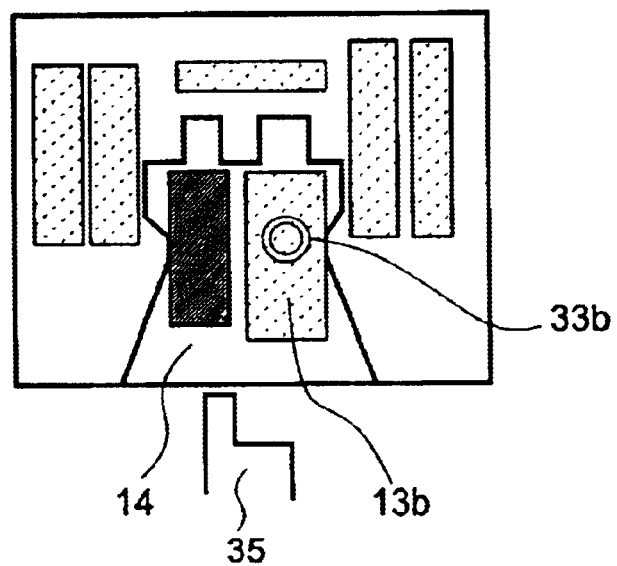

FIGS. 8(A) and (B) show a manufacturing method to mount two laser chips, in proximity to each other, on the sink portion of the present invention. FIG. 8(A) is a plane view showing attachment of the laser chip 13a of the two laser chips to the photoreceptor substrate. To assemble the laser chip 13a is brought to the sink table 14 by using an air pick 33a for transfer by vacuum suction. Next, a positioning tool 34 is used to press the laser chip 13a against slope f. Next, the tool 34 is returned, and the laser chip 13a is heated while it is pressed by the air pick 33a. When the adhesive has been melted, reciprocating vibration is supplied to the chip to remove bubbles, then the chip is positioned again by the tool 34 and cooled. This results in the laser chip 13a being fixed to the silicon table 14.

The positioning of the laser chip 13b is similarly performed. As the interval between the two chips is merely 50 $\mu$m, the two chip lengths are different, so as to ensure operability of the positioning tool. Further, to avoid movement of the laser chip 13a upon attachment of the laser chip 13b, the melting point of the adhesive differs corresponding to each of the two laser chips. For use of AuSn adhesive, TiPtAu is used in the lower electrodes. Upon scrubbing, the Au of the electrode material is melted into the AuSn, to raise the melting point of the AuSn from the initial melting point. For use of PbSn adhesive, as the melting point does not radically change before and after attachment, the melting point of the adhesive is changed corresponding to each of the two laser chips, such that the adhesive initially fixed has a higher melting point. Note that as shown in FIGS. 8(A) and 8(B), by forming the side wall portions to have the shape of, for example, a sector, with respect to the direction of laser insertion, the ease of laser insertion work is increased.

The preceding has been a description of the preferred embodiment of the invention. It will be appreciated that deviations and modifications can be made without departing from the scope of the invention, which is defined by the appended claims.

What is claimed is:

1. A laser module in which at least one semiconductor laser chip is mounted on a silicon substrate including at least one photodetector and a reflecting surface, wherein said reflecting surface is formed relative to a first slope of the silicon substrate, and wherein the first slope has a second slope recessed relative to the first slope to define a two-level step shape, with the second slope providing the reflecting surface to reflect laser light from the semiconductor laser chip, and the first slope is a reference surface for positioning the semiconductor laser chip relative to the reflecting surface.

2. An optical head comprising the laser module as in claim 1, an objective lens and a deflecting diffraction grating, the objective lens focusing light from said laser module as a light spot on an optical disk, and the deflecting diffraction grating guiding light reflected from the optical disk to the photodetectors in the laser module.

3. An optical information recording and reproducing apparatus having the optical head as in claim 2, optical disk discrimination means and light source selection means, which selects a light source by said light source selection means in accordance with the result of discrimination by said discrimination means and causes the light source to emit light.

4. An optical head having a laser module in which at least one semiconductor laser chip is mounted on a silicon substrate including photodetectors and a reflecting surface, an objective lens and a deflecting diffraction grating, wherein said reflecting surface is formed relative to a first slope of the silicon substrate formed opposite to a laser emitting surface of said semiconductor laser chip, and wherein said first slope has a recessed portion that defines said reflecting surface, said semiconductor laser chip being disposed against said first slope thereby being positioned relative to said reflecting surface, and wherein a laser beam from said semiconductor laser chip is reflected from said reflecting surface, the reflected light is focused as a light spot on an optical disk through the objective lens, and reflected light from the optical disk is guided to the photodetector in the laser module by the deflecting diffraction grating.

5. An optical information recording and reproducing apparatus having the optical head in 4, optical disk discrimination means and light source selection means, which selects a light source by said light source selection means in accordance with the result of discrimination by said discrimination means, and causes the light source to emit light.

6. A laser module in which at least one semiconductor laser chip is mounted on a silicon substrate which includes at least one photodetector, wherein said silicon substrate has slopes opposite to side surfaces of said semiconductor laser chip in a lengthwise direction, and wherein at least one of the slopes has two stepped portions, the semiconductor laser being disposed against the at least one slope in the region of one of the stepped portions.

7. A laser module according to 6, wherein a lower electrode on the side of said semiconductor laser chip to be mounted on the silicon substrate is wired to an upper portion of said silicon substrate via a slope of the stepped portions in the slopes opposite to the side surface of said semiconductor laser chip in the lengthwise direction.

8. An optical head having the laser module in claim 7, an objective lens which focuses light from said laser module as a light spot in an optical disk by the objective lens, and a deflecting diffraction grating which guides reflected light from the optical disk to the photodetector in the laser module by the deflecting diffraction grating.

9. A laser module in which a silicon substrate has a concave portion and a plurality of semiconductor laser chips are provided in said concave portion, wherein material of electrodes provided in said concave portion includes Au, and adhesive between said semiconductor laser chips and said concave portion is AuSn, and wherein the thermal conductivity of material of a package under said silicon substrate or a heat sink is equal to or higher than 50 W/mK.

10. An optical head having the laser module in claim 9 and a structure of die cast aluminum, wherein the bottom of a package of said laser module and said structure of die cast aluminum is connected by metal.

11. An optical head formed by attaching at least one semiconductor laser chip to a silicon substrate having a micromirror and a package to contain said silicon substrate, wherein as the relation between an angle a, formed by an attachment surface between said semiconductor laser chip and said silicon substrate with respect to the micromirror, and an angle β>0, formed between said attachment surface and an attachment surface of the package to the optical head satisfies the relationship 2α+β=270°.

12. A laser module comprising a silicon substrate including photodetectors arranged to receive light reflected from an optical disk, and two semiconductor laser chips, wherein said two semiconductor laser chips have different lengths and are mounted on said silicon substrate, said silicon substrate having a first sloped portion and a second sloped portion formed in said first sloped portion and recessed relative to said first sloped portion, wherein said second sloped portion serves as a reflecting surface to reflect laser light transmitted from each of said two semiconductor laser chips.

13. A two-laser module comprising a silicon substrate including photodetectors arranged so as to receive light reflected from an optical disk, and two semiconductor laser chips, wherein said two semiconductor laser chips have different lengths, and wherein a melting point of adhesive to fix a semiconductor laser chip having a shorter length to the silicon substrate is higher than that to fix the other semiconductor laser chip, wherein said two semiconductor laser chips are mounted on said silicon substrate, said silicon substrate having a first sloped portion and a second sloped portion formed in said first sloped portion and recessed relative to said first sloped portion, wherein said second sloped portion serves as a reflecting surface to reflect laser light transmitted from each of said two semiconductor laser chips.

* * * * *